(12) United States Patent
Ebina et al.

(10) Patent No.: US 6,413,821 B1
(45) Date of Patent: Jul. 2, 2002

(54) METHOD OF FABRICATING SEMICONDUCTOR DEVICE INCLUDING NONVOLATILE MEMORY AND PERIPHERAL CIRCUIT

(75) Inventors: Akihiko Ebina, Nagano-ken; Susumu Inoue, Sakata, both of (JP)

(73) Assignees: Seiko Epson Corporation, Tokyo (JP); Halo LSI Design & Device Technology, Inc., Wappingers Falls, NY (US)

( * ) Notice: Subject to any disclaimer, the term of this patent is extended or adjusted under 35 U.S.C. 154(b) by 0 days.

(21) Appl. No.: 09/953,856

(22) Filed: Sep. 18, 2001

(51) Int. Cl.[7] .............................................. H01L 21/336
(52) U.S. Cl. ...................... 438/257; 438/258; 438/267; 438/286
(58) Field of Search ................................ 438/257–262, 438/300, 350, 267, 266, 286; 257/345–347

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,917,218 A * | 6/1999 | Choi et al. ................... 257/345 |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |

OTHER PUBLICATIONS

09/953,855 Sep. 18, 2001.
Hayashi, Yutaka et al., "Twin MONOS Cell with Dual Control Gates", *2000 IEEE Symposium on VLSI Technology Digest of Technical Papers*.
Chang, Kuo–Tung et al., "A New SONOS Memory Using Source–Side Injection for Programming", *1998 IEEE Electron Device Letters*, vol. 19, No. 7, Jul. 1998, pp. 253–255.
Chen, Wei–Ming et al., "A Novel Flash Memory Device with SPlit Gate Source Side Injection and ONO Charge Storage Stack (SPIN)", *1997 Symposium on VLSI Technology Digest of Technical Papers*, pp. 63–64.

* cited by examiner

Primary Examiner—Keith Christianson
Assistant Examiner—Yennhu B. Huynh
(74) Attorney, Agent, or Firm—Oliff & Berridge, PLC

(57) ABSTRACT

A fabrication method of the present invention includes the following steps: A step of forming gate electrodes in a logic circuit region; a step of forming first and second protective insulating layers in the logic circuit region; a step of forming a first gate insulating layer and a word gate layer in a memory region; a step of forming a second gate insulating layer on a semiconductor substrate and forming side insulating layers on both sides of the word gate layer in the memory region; a step of anisotropically etching the second conductive layer, thereby forming control gates in the shape of sidewalls and a conductive layer continuous with the control gates in regions in which common contact sections are formed; a step of removing the first and second protective insulating layers; and a step of forming impurity layers which form either a source or drain.

4 Claims, 14 Drawing Sheets

PRIOR ART

METHOD OF FABRICATING SEMICONDUCTOR DEVICE INCLUDING NONVOLATILE MEMORY AND PERIPHERAL CIRCUIT

TECHNICAL FIELD

The present invention relates to a method of fabricating a semiconductor device including a memory region in which nonvolatile semiconductor memory devices including two charge storage regions for one word gate are arranged in an array and a logic circuit region.

BACKGROUND

As one type of nonvolatile semiconductor memory device, a Metal Oxide Nitride Oxide Semiconductor (MONOS) or Silicon Oxide Nitride Oxide Silicon (SONOS) memory device is known. In such a memory device, a gate insulating layer between a channel region and a control gate is formed of a laminate consisting of a silicon oxide layer and a silicon nitride layer, and a charge is trapped in the silicon nitride layer.

A device shown in FIG. 22 is known as such a MONOS nonvolatile semiconductor memory device (Y. Hayashi, et al., 2000 Symposium on VLSI Technology Digest of Technical Papers, pp. 122–123).

In this MONOS memory cell 100, a word gate 14 is formed on a semiconductor substrate 10 with a first gate insulating layer 12 interposed. A first control gate 20 and a second control gate 30 are disposed on either side of the word gate 14 in the shape of sidewalls. A second gate insulating layer 22 is present between the bottom of the first control gate 20 and the semiconductor substrate 10. An insulating layer 24 is present between the side of the first control gate 20 and the word gate 14. A second gate insulating layer 32 is present between the bottom of the second control gate 30 and the semiconductor substrate 10. An insulating layer 34 is present between the side of the second control gate 30 and the word gate 14. Impurity layers 16 and 18 which form either a source region or a drain region are formed in the semiconductor substrate 10 between the control gate 20 and the control gate 30 facing each other in the adjacent memory cells.

As described above, one memory cell 100 includes two MONOS memory elements, one on each side of the word gate 14. These two MONOS memory elements are controlled separately. Therefore, one memory cell 100 is capable of storing 2 bits of information.

SUMMARY

An objective of the present invention is to provide a method of fabricating a semiconductor device including MONOS nonvolatile semiconductor memory devices having two charge storage regions, in which a memory region including MONOS memory cells and a logic circuit region including a peripheral circuit for a memory and the like are formed on the same substrate.

The present invention provides a method of fabricating a semiconductor device including a memory region including nonvolatile memory devices and a logic circuit region including a peripheral circuit for the nonvolatile memory devices, the method comprising the following steps in that order:

a step of forming a first insulating layer over a semiconductor layer, step of forming a first conductive layer over the first insulating layer, a step of forming a stopper layer over the first conductive layer, a step of removing the stopper layer in the logic circuit region, a step of patterning the first conductive layer in the logic circuit region, thereby forming gate electrodes of insulated gate field effect transistors in the logic circuit region, a step of forming sidewall insulating layers at least on both sides of the gate electrodes, a step of forming a protective insulating layer in the logic circuit region so as to cover at least the gate electrodes, a step of patterning the stopper layer and the first conductive layer in the memory region, a step of forming an ONO film over the entire surface of the memory region and the logic circuit region, a step of forming a second conductive layer over the ONO film, a step of anisotropically etching the second conductive layer, thereby forming control gates in the shape of sidewalls at least on both sides of the first conductive layer in the memory region with the ONO film interposed, a step of removing the protective insulating layer in the logic circuit region, a step of forming first impurity layers which form either a source region or a drain region of the nonvolatile memory devices and second impurity layers which form either a source region or a drain region of the insulated gate field effect transistors, a step of forming silicide layers on the surfaces of the first impurity layers, the second impurity layers and the gate electrodes, a step of forming a second insulating layer over the entire surface of the memory region and the logic circuit region, a step of polishing the second insulating layer so that the stopper layer is exposed in the memory region and the gate electrodes are not exposed in the logic circuit region, a step of removing the stopper layer in the memory region, and a step of patterning the first conductive layer in the memory region, thereby forming word gates of the nonvolatile memory devices in the memory region.

DETAILED DESCRIPTION

An embodiment of the present invention is described below with reference to the drawings. Before describing a fabrication method according to the embodiment of the present invention, a semiconductor device obtained by this fabrication method is described below.

Figure 1:
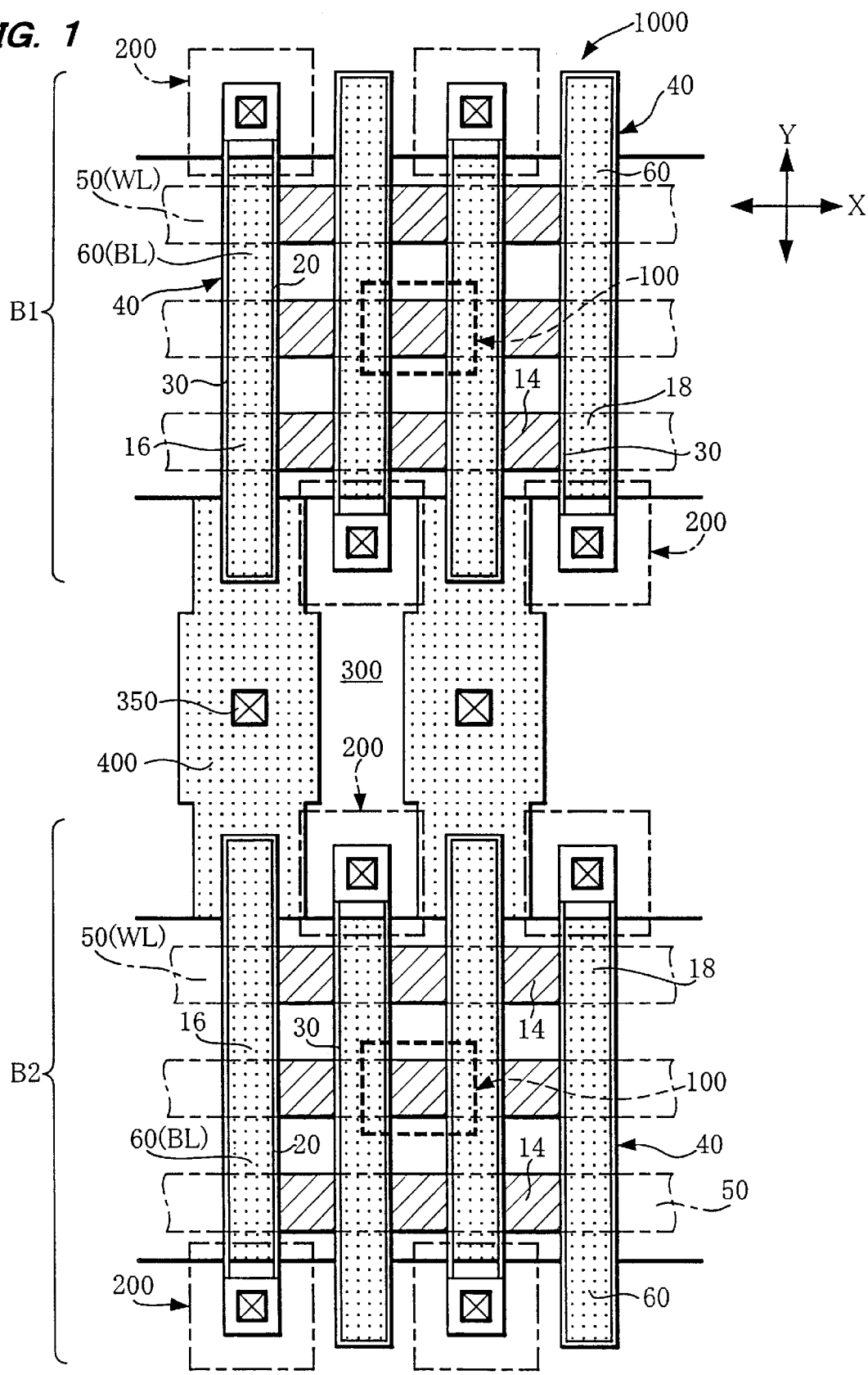
FIG. 1 is a plan view schematically showing a layout of a memory region of a semiconductor device according to an embodiment of the present invention.
Figure 2:
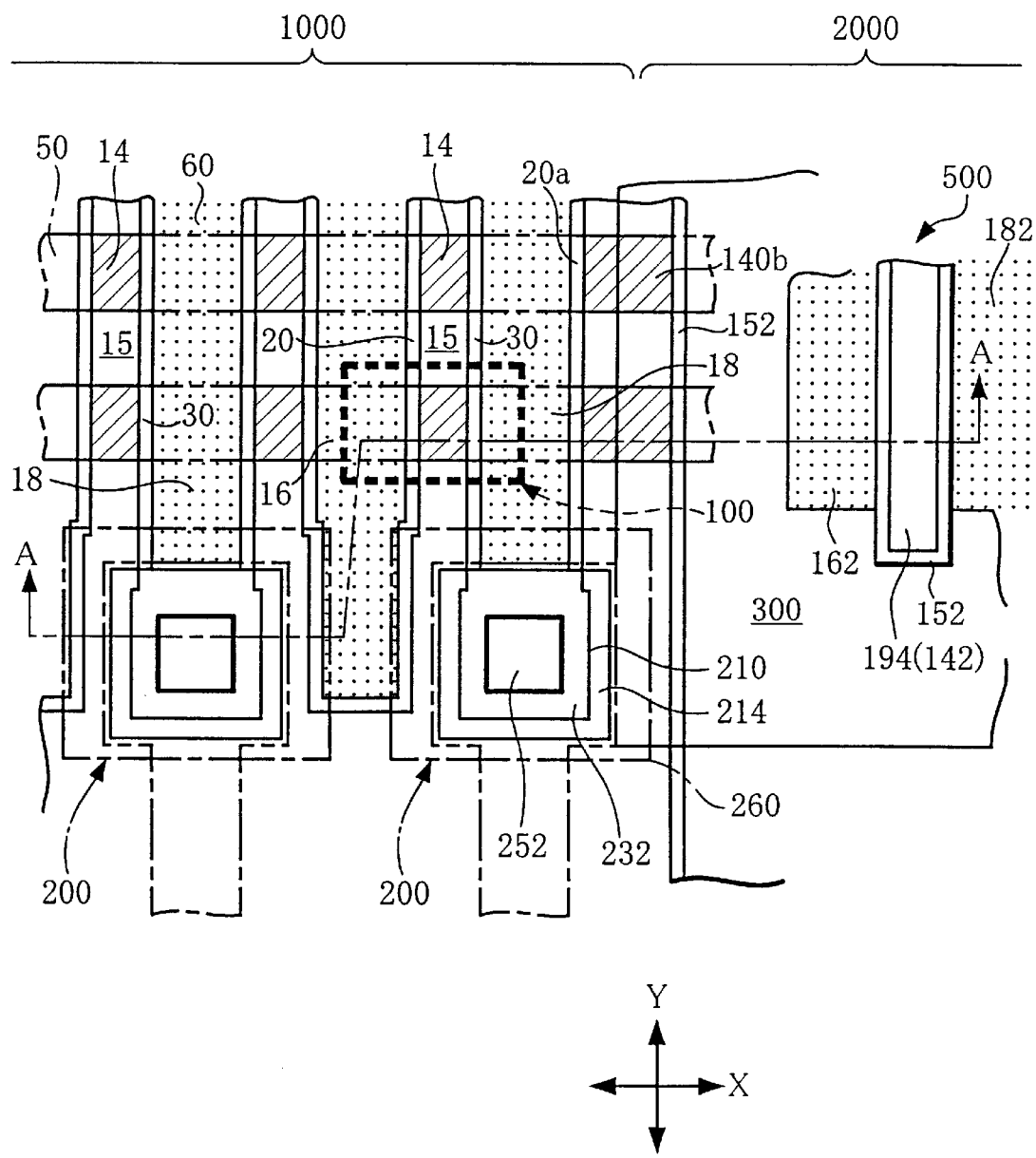
FIG. 2 is a plan view schematically showing a portion of the semiconductor device according to an embodiment of the present invention.
Figure 3:
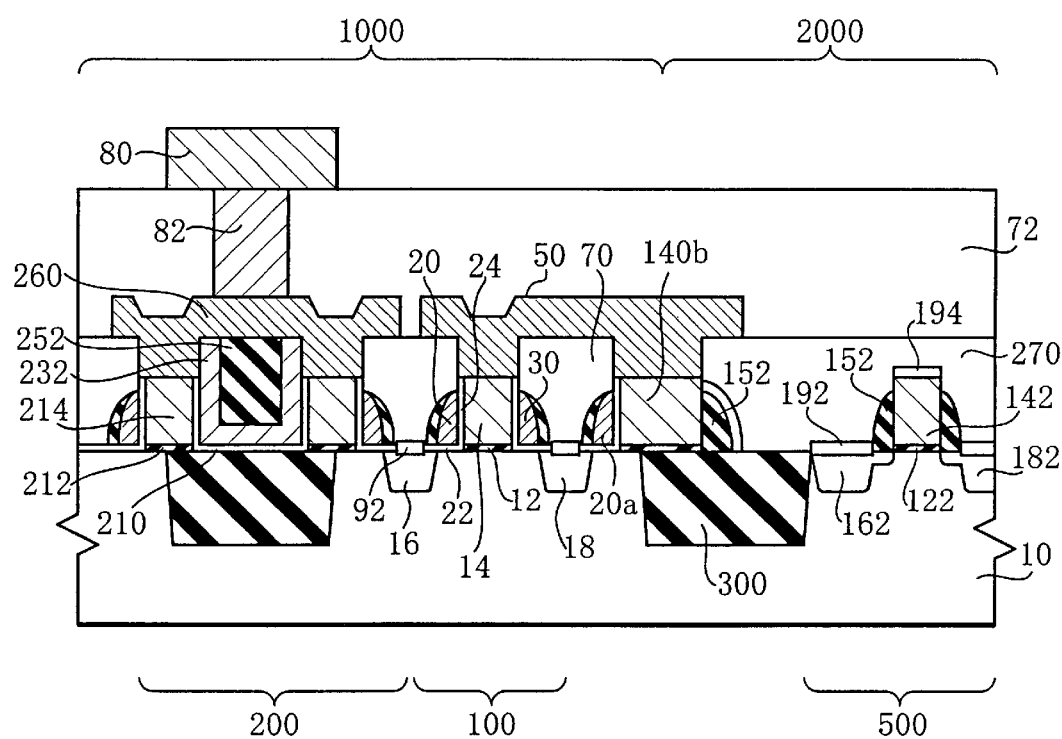
FIG. 3 is a cross-sectional view schematically showing section along the line A—A shown in FIG. 2.

FIG. 1 is a plan view showing a layout of a memory region of a semiconductor device. FIG. 2 is a plan view showing a portion of a semiconductor device according to the present embodiment. FIG. 3 is a cross-sectional view along the line A—A shown in FIG. 2.

The semiconductor device shown in FIGS. 1 to 3 includes a memory region 1000 in which MONOS nonvolatile semiconductor memory devices (hereinafter called "memory cells") 100 are arranged in a plurality of rows and columns in a grid array to make up a memory cell array, and a logic circuit region 2000 including a peripheral circuit for the memory and the like.

Device Structure

The layout of the memory region 1000 is described below with reference to FIG. 1.

FIG. 1 shows a first block B1 and a second block B2 adjacent thereto which are a part of the memory region 1000. An element isolation region 300 is formed in a part of a region between the first block B1 and the second block B2. In each of the blocks B1 and B2, a plurality of word lines 50 (WL) extending in the X direction (row direction) and a plurality of bit lines 60 (BL) extending in the Y direction (column direction) are provided. One word line 50 is connected to a plurality of word gates 14 arranged in the X direction. The bit lines 60 are formed of impurity layers 16 and 18.

Conductive layers 40 which form first and second control gates 20 and 30 are formed so as to enclose each of the impurity layers 16 and 18. Specifically, the first and second control gates 20 and 30 extend respectively in the Y direction, and a pair of first and second control gates 20 and 30 are connected each other on one side by the conductive layer extending in the X direction. The other ends of the pair of first and second control gates 20 and 30 are connected to one common contact section 200. Therefore, each of the first and second control gates 20 and 30 has a function of a control gate for the memory cells and a function of interconnection which connects each control gate arranged in the Y direction.

Each memory cell 100 includes one word gate 14, the first and second control gates 20 and 30 formed on either side of the word gate 14, and the impurity layers 16 and 18 formed outside the control gates 20 and 30 in a semiconductor substrate. The adjacent memory cells 100 share the impurity layers 16 and 18.

The impurity layer 16 formed in the block B1 and the impurity layer 16 formed in the block B2, which are adjacent in the Y direction are electrically connected by a contact impurity layer 400 formed in the semiconductor substrate. The contact impurity layer 400 is formed on a side of the impurity layer 16 opposite to the common contact section 200 of the control gates.

A contact 350 is formed on the contact impurity layer 400. The bit line 60 formed of the impurity layer 16 is electrically connected to an interconnect layer in an upper layer by the contact 350.

Similarly, two impurity layers 18 adjacent in the Y direction are electrically connected by a contact impurity layer (not shown) on a side on which the common contact section 200 is not disposed.

As shown in FIG. 1, a planar layout of a plurality of common contact sections 200 in one block forms an alternate arrangement in which the common contact sections 200 are provided to the impurity layer 16 and the impurity layer 18 alternately on the opposing sides. Similarly, a planar layout of a plurality of contact impurity layers 400 in one block forms an alternate arrangement in which the contact impurity layers 400 are provided to the impurity layer 16 and the impurity layer 18 alternately on the opposing sides.

The planar structure and the cross-sectional structure of the semiconductor device are described below with reference to FIGS. 2 and 3. The logic circuit region 2000 which, for example, forms a peripheral circuit for a memory is disposed at a position adjacent to the memory region 1000. The memory region 1000 and the logic circuit region 2000 are electrically isolated by the element isolation region 300. At least the memory cell 100 is formed in the memory region 1000. At least an insulated gate field effect transistor (hereinafter called "MOS transistor") 500 which forms a logic circuit is formed in the logic circuit region 2000.

The memory region 1000 is described below.

The memory cell 100 includes the word gate 14 formed on a semiconductor substrate 10 with a first gate insulating layer 12 interposed, the impurity layers 16 and 18 which form either a source region or a drain region in the semiconductor substrate 10, and the first and second control gates 20 and 30 in the shape of sidewalls formed along either side of the word gate 14. Silicide layers 92 are formed on the impurity layers 16 and 18.

The first control gate 20 is disposed on the semiconductor substrate 10 with a second gate insulating layer 22 interposed and disposed on one side of the word gate 14 with a side insulating layer 24 interposed. Similarly, the second control gate 30 is disposed on the semiconductor substrate 10 with the second gate insulating layer 22 interposed and disposed on the other side of the word gate 14 with the side insulating layer 24 interposed.

The second gate insulating layer 22 and the side insulating layer 24 are ONO films. Specifically, the second gate insulating layer 22 and the side insulating layer 24 are laminated films consisting of a bottom silicon oxide layer (first silicon oxide layer), a silicon nitride layer, and a top silicon oxide layer (second silicon oxide layer).

The first silicon oxide layer of the second gate insulating layer 22 forms a potential barrier between a channel region and a charge storage region. The silicon nitride layer of the second gate insulating layer 22 functions as the charge storage region in which carriers (electrons, for example) are trapped. The second silicon oxide layer of the second gate insulating layer 22 forms a potential barrier between the control gate and the charge storage region.

The side insulating layer 24 electrically isolates the word gate 14 from the control gates 20 and 30. The upper end of the side insulating layer 24 is located at a position higher than the upper ends of the control gates 20 and 30 with respect to the semiconductor substrate 10 in order to prevent short circuits between the word gate 14 and the first and second control gates 20 and 30.

The side insulating layer 24 and the second gate insulating layer 22 are formed in the same deposition step and have the same layer structure.

In the adjacent memory cells 100, a buried insulating layer 70 is formed between the first control gate 20 and the second control gate 30 adjacent thereto. The buried insulating layer 70 covers the control gates 20 and 30 so that at least the control gates 20 and 30 are not exposed. Specifically, the upper surface of the buried insulating layer 70 is located at a position higher than the upper end of the side insulating layer 24 with respect to the semiconductor substrate 10. The first and second control gates 20 and 30 can be electrically isolated from the word gate 14 and the word line 50 more reliably by forming the buried insulating layer 70 in this manner.

Conductive layers for supplying a specific potential to the control gates 20 and 30 are formed in the common contact sections 200. The common contact section 200 is formed of a first contact insulating layer 212, a second contact insulating layer 210, a first contact conductive layer 214, a second contact conductive layer 232, a third contact insulating layer 252, and a third contact conductive layer 260.

The first contact insulating layer 212 is formed in the same step as the first gate insulating layer 12.

The second contact insulating layer 210 is formed in the same step as the second gate insulating layer 22 and the side insulating layer 24. Therefore, the second contact insulating layer 210 is formed of a laminate consisting of the first silicon oxide layer, the silicon nitride layer, and the second silicon oxide layer.

The first contact conductive layer 214 is formed in the same step as the word gate 14. The first contact conductive layer 214 is formed outside the second contact insulating layer 210.

The second contact conductive layer 232 is formed inside the second contact insulating layer 210. The second contact conductive layer 232 is formed in the same step as the first and second control gates 20 and 30 so as to be continuous with the control gates 20 and 30. Therefore, the second contact conductive layer 232 and the control gates 20 and 30 are formed of the same material.

The third contact insulating layer 252 is formed inside the second contact conductive layer 232. The third contact insulating layer 252 is formed in the same step as a sidewall insulating layer 152.

The third contact conductive layer 260 is formed in the same step as the word line 50 and connected to the first contact conductive layer 214 and the second contact conductive layer 232.

The MOS transistor 500 is formed in the logic circuit region 2000. The MOS transistor 500 includes a gate electrode 142 formed on the semiconductor substrate 10 with a third gate insulating layer 122 interposed, impurity layers 162 and 182 formed in the semiconductor substrate 10 which form either a source region or a drain region, and sidewall insulating layers 152 formed along both sides of the gate electrode 142. Silicide layers 192 are formed on the upper surfaces of the impurity layers 162 and 182. A silicide layer 194 is formed on the upper surface of the gate electrode 142.

The MOS transistor 500 is covered with an insulating layer 270 in the logic circuit region 2000. The insulating layer 270 is formed in the same step as the buried insulating layer 70.

A boundary section 140b is formed of the same material as the word gate 14 and the gate electrode 142 in the boundary region between the memory region 1000 and the logic circuit region 2000, as shown in FIGS. 2 and 3. The boundary section 140b is formed in the same deposition step as the word gate 14 and the gate electrode 142. At least a part of the boundary section 140b is formed on the element isolation region 300.

A conductive layer 20a in the shape of a sidewall is formed of the same material as the control gates 20 and 30 on one side (side of the memory region 1000) of the boundary section 140b. This sidewall conductive layer 20a extends in the Y direction and is electrically connected to the control gate 30 adjacent thereto through the common contact section 200. The sidewall conductive layer 20a is not used as the control gate for the memory cells. However, electrical characteristics of the control gate 30 adjacent to the sidewall conductive layer 20a can be made equal to electrical characteristics of other control gates by electrically connecting the sidewall conductive layer 20a to the control gate 30 adjacent thereto.

An insulating layer 152 in the shape of a sidewall formed in the same step as the sidewall insulating layer 152 of the MOS transistor 500 is provided on the other side (side of the logic circuit region 2000) of the boundary section 140b.

An interlayer dielectric 72 is formed on the semiconductor substrate 10 on which the memory cell 100, the MOS transistor 500, and the like are formed. A contact hole which reaches the third contact conductive layer 260 in the common contact section 200 is formed in the interlayer dielectric 72, for example. The contact hole is filled with a conductive layer 82 such as a tungsten plug, copper plug or the like. The conductive layer 82 is connected to an interconnect layer 80 formed on the interlayer dielectric 72.

Fabrication Method of Semiconductor Device

The method of fabricating a semiconductor device according to the present embodiment is described below with reference to FIGS. 4 to 21. Each cross-sectional view corresponds to the section along the line A—A shown in FIG. 2. In FIGS. 4 to 21, components that are the same as those in FIGS. 1 to 3 are denoted by the same reference numbers and further description is omitted.

Figure 4:
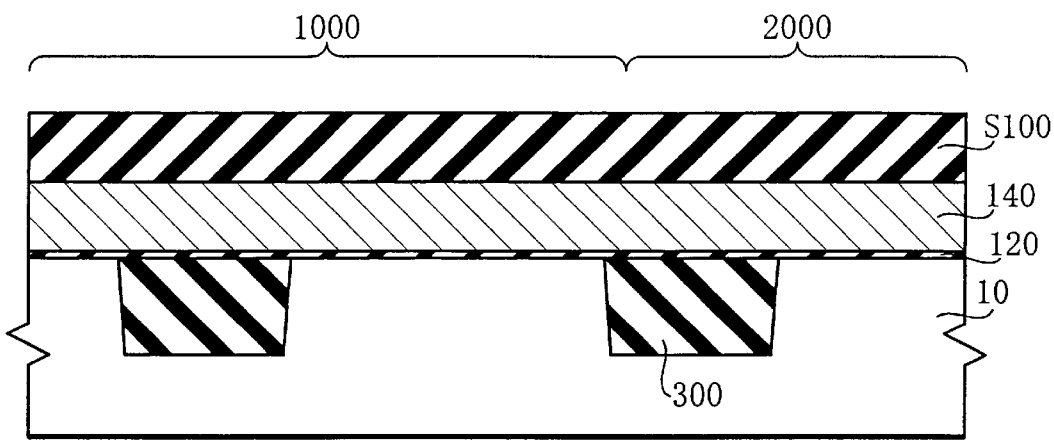
FIG. 4 is a cross-sectional view showing a step of a method of fabricating the semiconductor device shown in FIGS. 1 to 3.

(1) The element isolation regions 300 are formed on the surface of the semiconductor substrate 10 using a trench isolation process, as shown in FIG. 4. The contact impurity layers 400 (see FIG. 1) are formed in the semiconductor substrate 10 by ion implantation.

An insulating layer 120, a gate layer 140 formed of doped polysilicon, and a stopper layer S100 used in a CMP process described later are formed on the surface of the semiconductor substrate 10. A silicon nitride layer, for example, may be used as the stopper layer S100.

Figure 5:
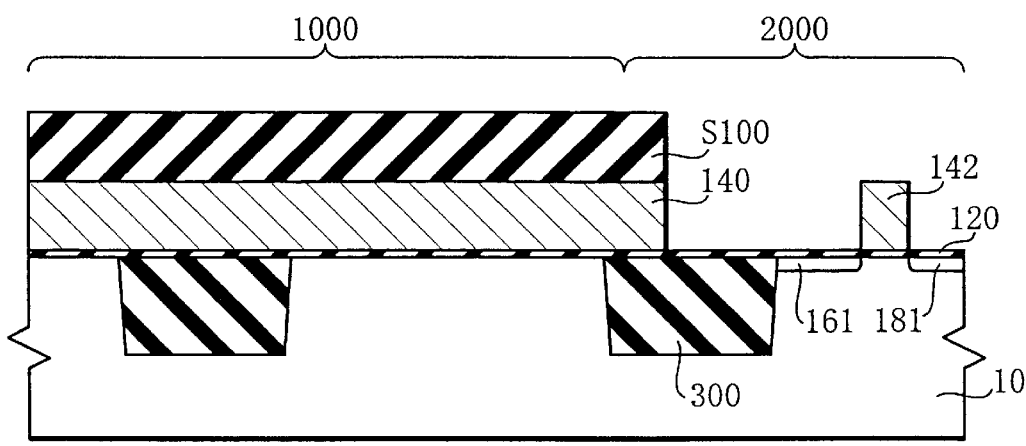
FIG. 5 is a cross-sectional view showing a step of a method of fabricating the semiconductor device shown in FIGS. 1 to 3.

(2) The stopper layer S100 is patterned so that the stopper layer S100 remains in the memory region 1000, as shown in FIG. 5. The gate layer 140 (see FIG. 4) is patterned in the logic circuit region 2000 using conventional lithography and etching. The gate electrode 142 of the MOS transistor is formed in the logic circuit region 2000 in this step. The gate layer 140 remains without being patterned in the memory region 1000 due to the presence of the stopper layer S100.

Extension layers 161 and 181 of a source region and a drain region are formed in the logic circuit region 2000 by doping the semiconductor substrate 10 with N-type impurities.

Figure 6:
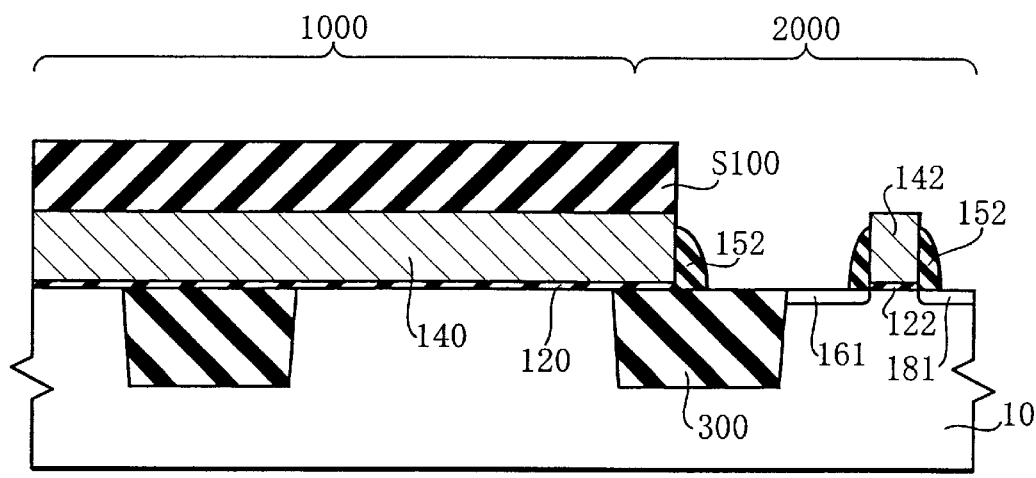
FIG. 6 is a cross-sectional view showing a step of a method of fabricating the semiconductor device shown in FIGS. 1 to 3.

(3) The sidewall insulating layers 152 are formed on both sides of the gate electrode 142 in the logic circuit region 2000 by a conventional method, as shown in FIG. 6. Specifically, an insulating layer (not shown) such as silicon oxide or silicon nitride oxide is formed over the entire surface of the memory region 1000 and the logic circuit region 2000. The entire surface of the insulating layer is anisotropically etched, whereby the sidewall insulating layers 152 are formed on both sides of the gate electrode 142 in the logic circuit region 2000. The sidewall insulating layer 152 is also formed on the end of the gate layer 140 at the boundary between the memory region 1000 and the logic circuit region 2000.

Figure 7:
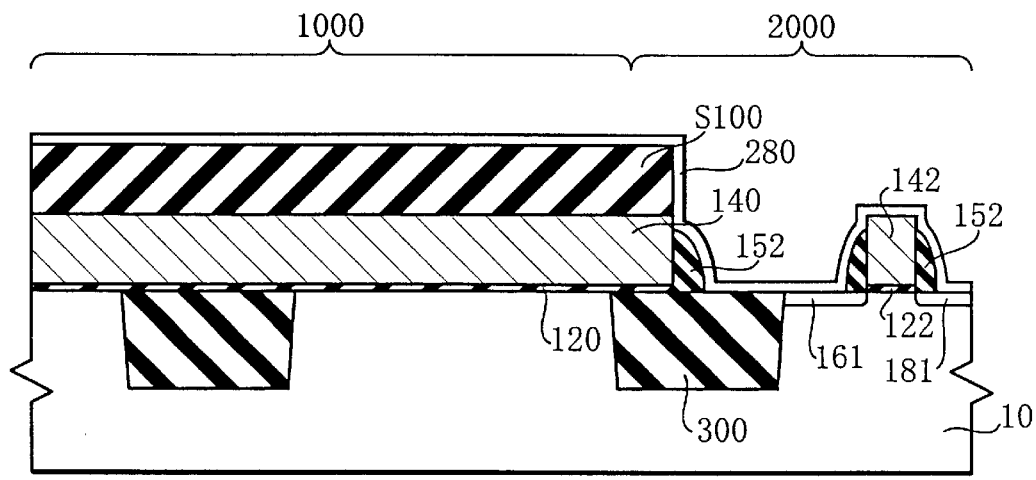
FIG. 7 is a cross-sectional view showing a step of a method of fabricating the semiconductor device shown in FIGS. 1 to 3.
Figure 8:
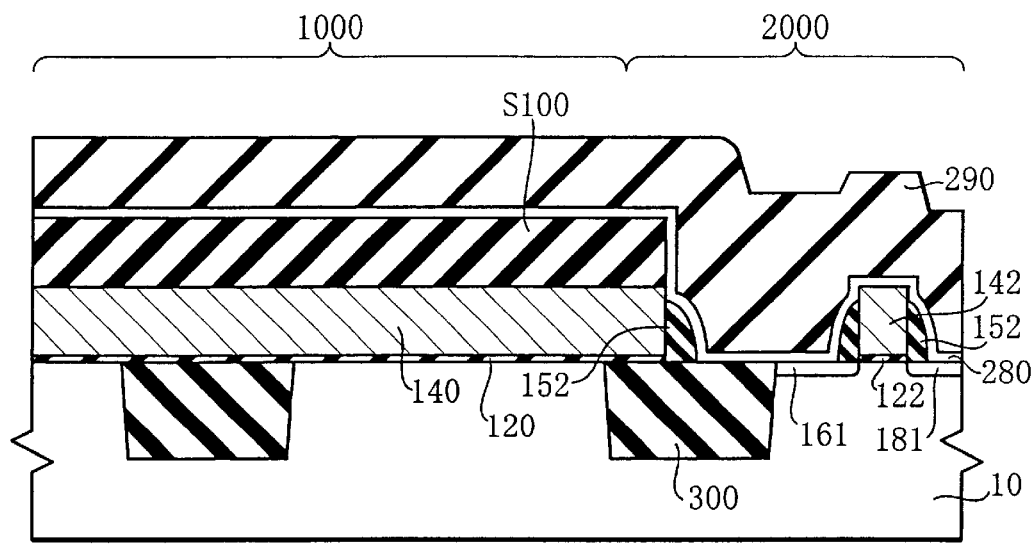
FIG. 8 is a cross-sectional view showing a step of a method of fabricating the semiconductor device shown in FIGS. 1 to 3.
Figure 9:
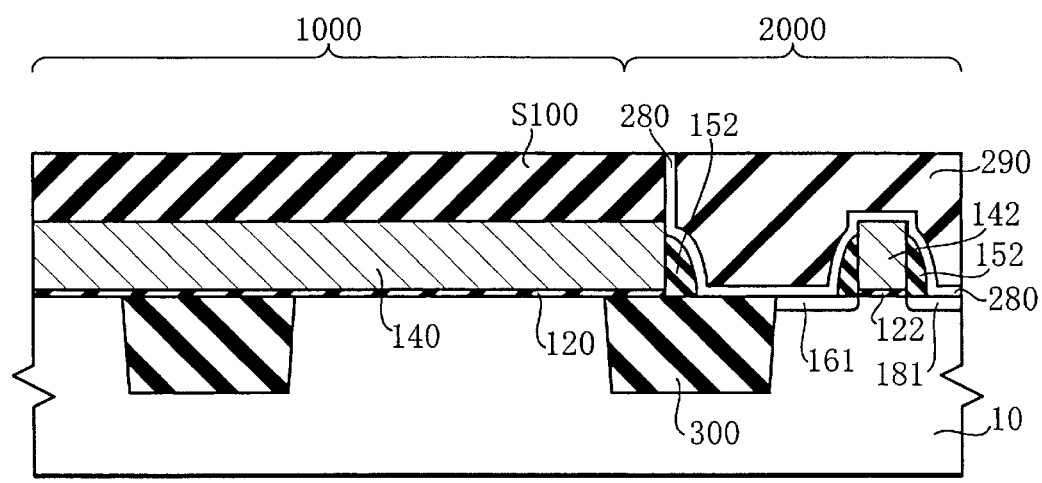
FIG. 9 is a cross-sectional view showing a step of a method of fabricating the semiconductor device shown in FIGS. 1 to 3.

(4) A film-shaped first protective insulating layer 280 is formed of silicon nitride or the like over the entire surface of the memory region 1000 and the logic circuit region 2000, as shown in FIG. 7. A second protective insulating layer 290 is formed of silicon oxide, silicon nitride oxide or the like, as shown in FIG. 8. The second protective insulating layer 290 and the first protective insulating layer 280 are polished using a CMP process so that the stopper layer S100 is exposed, as shown in FIG. 9.

In the logic circuit region 2000, this step causes the first and second protective insulating layers 280 and 290 to be layered on the semiconductor substrate 10 on which the gate electrode 142, the sidewall insulating layer 152, and the like are formed. In the memory region 1000, the gate layer 140 is covered with the stopper layer S100.

Figure 10:
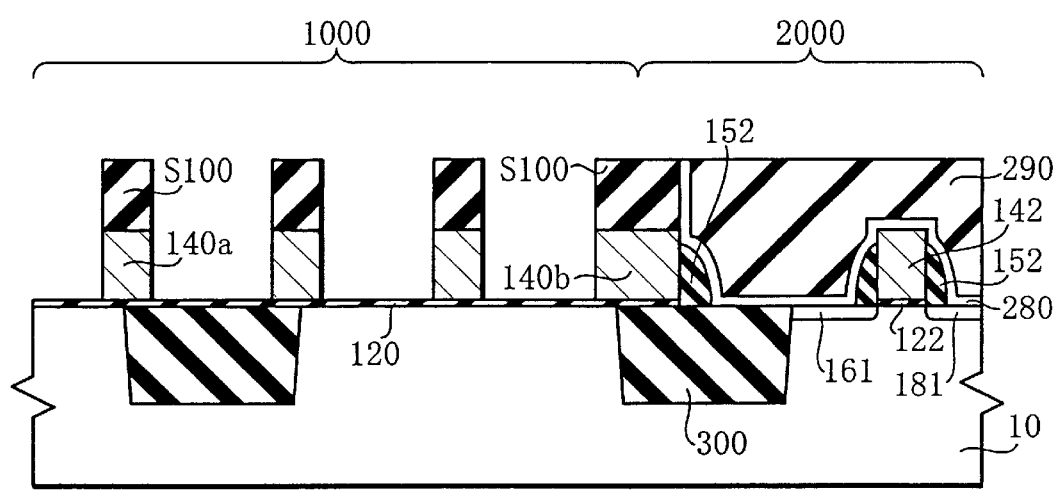
FIG. 10 is a cross-sectional view showing a step of a method of fabricating the semiconductor device shown in FIGS. 1 to 3.
Figure 11:
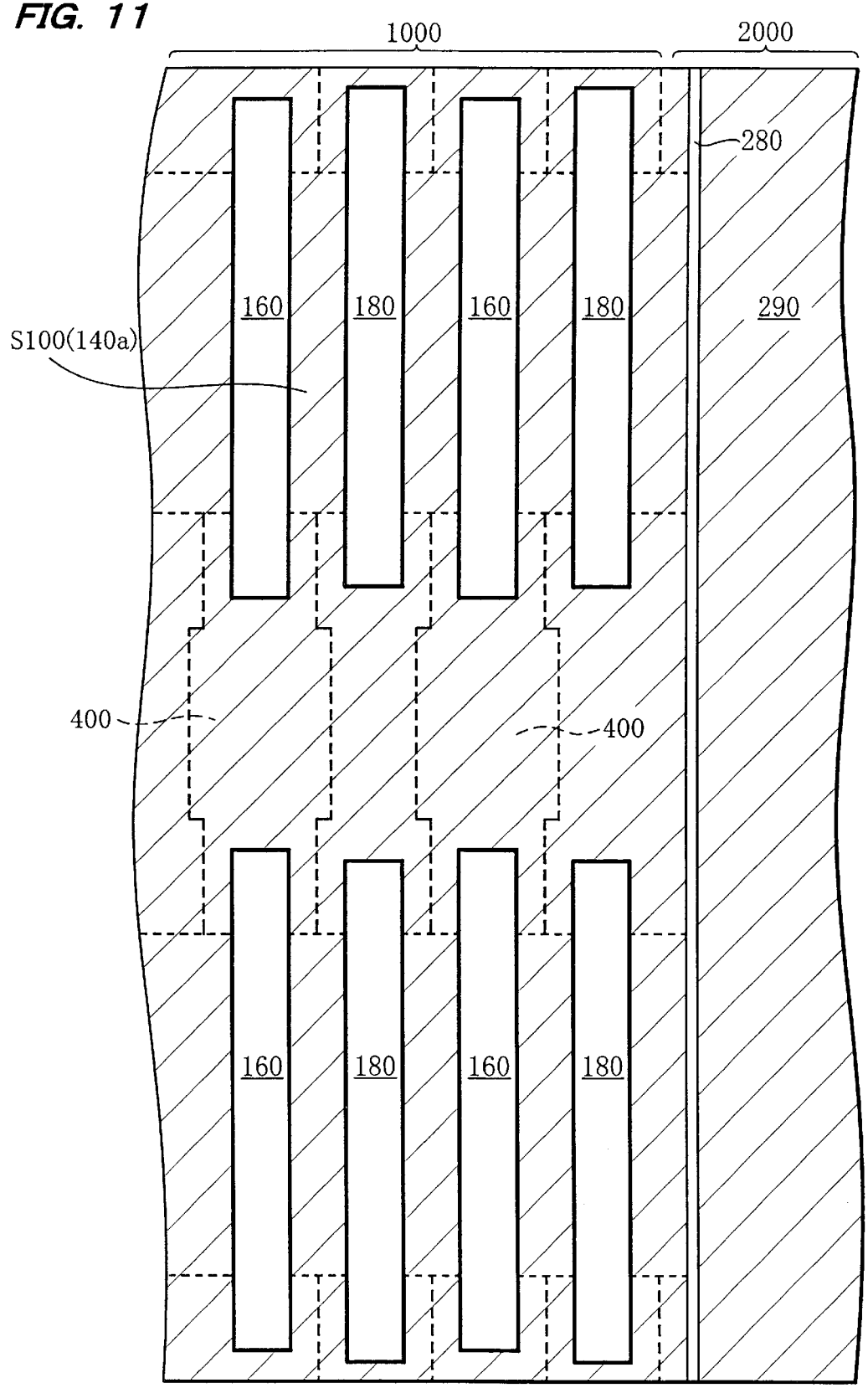
FIG. 11 is a plan view showing the step of the method of fabricating the semiconductor device shown in FIG. 10.

(5) A resist layer (not shown) with a specific pattern is formed. The gate layer 140 in the memory region 1000 is patterned using the resist layer as a mask, thereby forming a word gate layers 140a, as shown in FIG. 10. In this step, openings 160 and 180 are formed in a laminate consisting of the gate layer 140 and the stopper layer S100 in the memory region 1000 as shown in a plan view in FIG. 11, whereby the word gate layer 140a and the stopper layer S100 are patterned. No opening is formed in the logic circuit region 2000.

The openings 160 and 180 approximately correspond to regions in which the impurity layers are formed by ion implantation in a step described later. The side insulating layers and the control gates are formed along the sides of the openings 160 and 180 in a step described later.

In this step, the boundary section 140b formed of the same material as the gate layer 140 and the stopper layer S100 on the boundary section 140b are formed on the element isolation region 300 at the boundary between the memory region 1000 and the logic circuit region 2000, as shown in FIG. 10.

Figure 12:
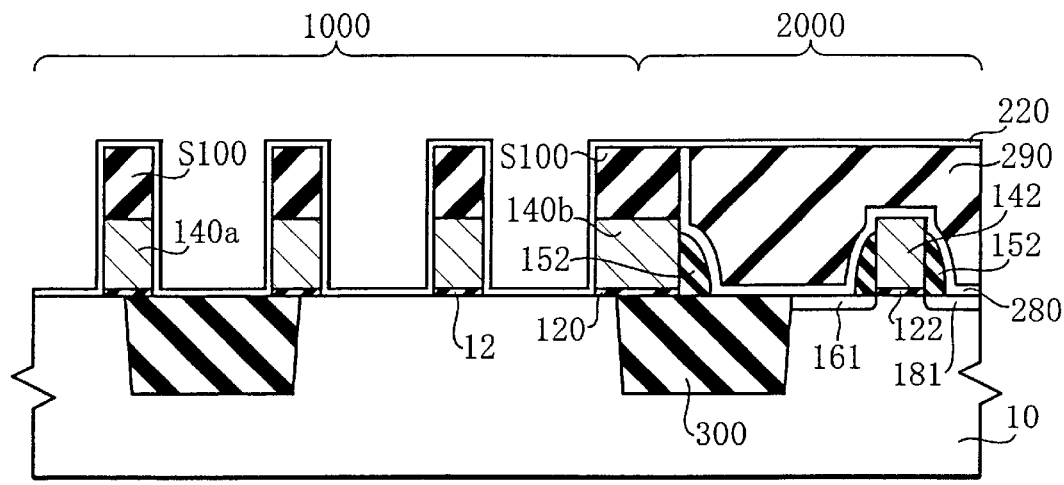
FIG. 12 is a cross-sectional view showing a step of a method of fabricating the semiconductor device shown in FIGS. 1 to 3.

(6) An ONO film 220 is formed over the entire surface of the memory region 1000 and the logic circuit region 2000, as shown in FIG. 12. The ONO film 220 is formed by depositing a first silicon oxide layer, a silicon nitride layer, and a second silicon oxide layer in that order. The first silicon oxide layer may be deposited using a thermal oxidation process, a CVD process, or the like. The silicon nitride layer may be deposited using, for example, a CVD process. The second silicon oxide layer may be deposited using a CVD process such as a high temperature oxidation (HTO) process. It is desirable to anneal these deposited layers, thereby causing each layer to be densified.

The ONO film 220 formed of the first silicon oxide layer, the silicon nitride layer and the second silicon oxide layer is patterned in a step described later, thereby forming the second gate insulating layer 22 and the side insulating layers 24 for the control gates 20 and 30 and the second contact insulating layer 210, as shown in FIG. 3.

Figure 13:
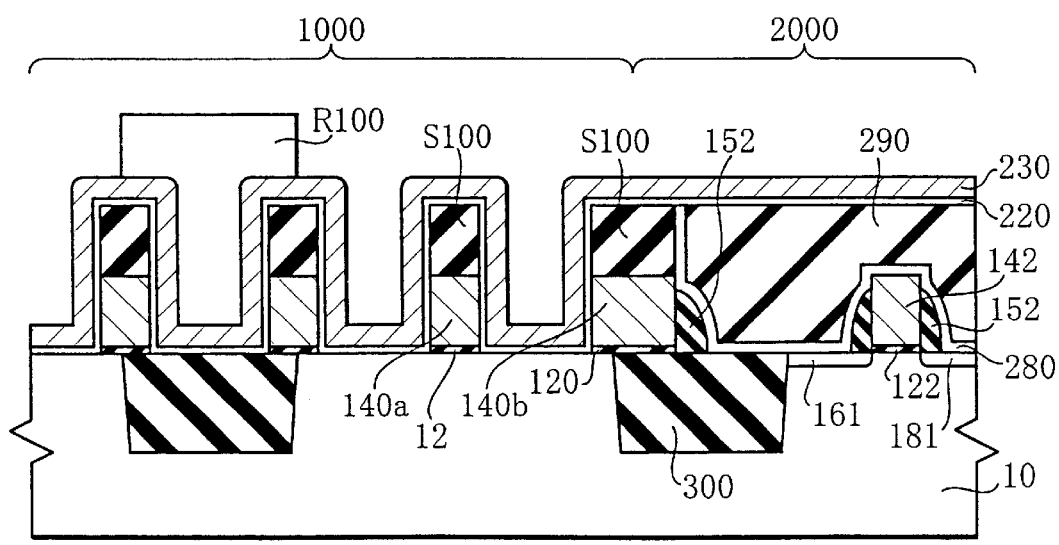
FIG. 13 is a cross-sectional view showing a step of a method of fabricating the semiconductor device shown in FIGS. 1 to 3.

(7) A doped polysilicon layer 230 is formed over the entire surface of the ONO film 220, as shown in FIG. 13. A first resist layer R100 is formed in a region in which the common contact section is formed.

Figure 14:
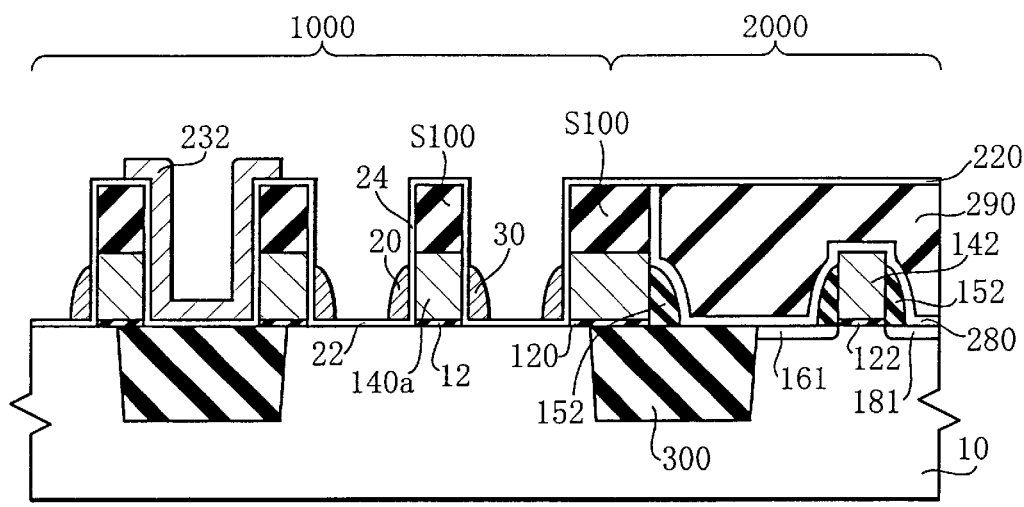
FIG. 14 is a cross-sectional view showing a step of a method of fabricating the semiconductor device shown in FIGS. 1 to 3.

(8) The entire surface of the doped polysilicon layer 230 (see FIG. 13) is anisotropically etched, thereby forming the conductive layers 40 (see FIG. 1) which form the first and second control gates 20 and 30 and the second contact conductive layer 232 (see FIG. 3), as shown in FIG. 14. Specifically, in this step, the control gates 20 and 30 in the shape of sidewalls are formed on the second gate insulating layer 22 along the sides of the openings 160 and 180 (see FIG. 11) in the memory region 1000 with the side insulating layers 24 interposed therebetween. The control gates 20 and 30 are formed so that the upper ends thereof are located at a position lower than the upper surface of the word gate layer 140a. The second contact conductive layer 232 for the common contact sections continuous with the control gates 20 and 30 is formed in the areas masked by the first resist layers R100 during this step. The first resist layer R100 is then removed.

Figure 15:
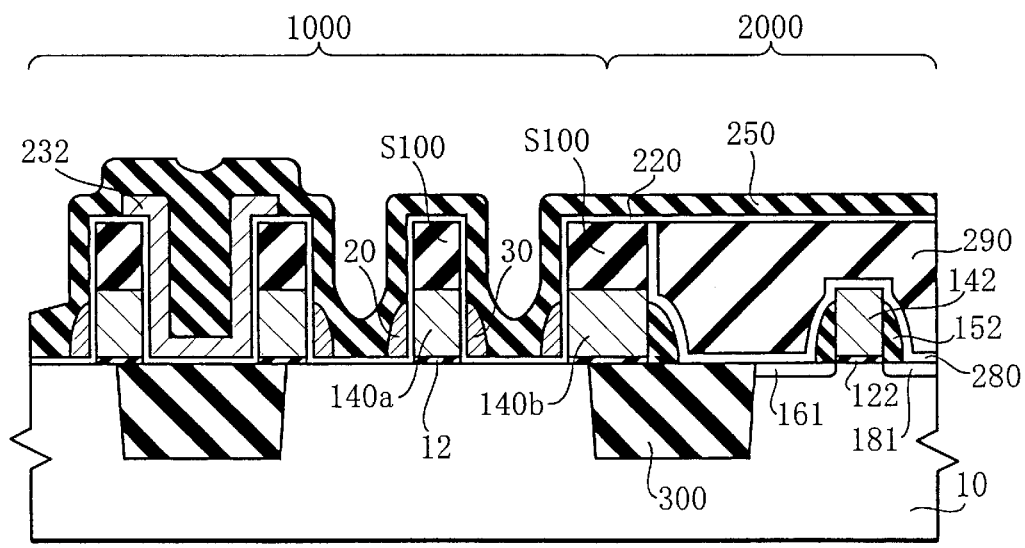
FIG. 15 is a cross-sectional view showing a step of a method of fabricating the semiconductor device shown in FIGS. 1 to 3.

(9) An insulating layer 250 such as silicon oxide or silicon nitride oxide is formed over the entire surface of the memory region 1000 and the logic circuit region 2000, as shown in FIG. 15.

Figure 16:
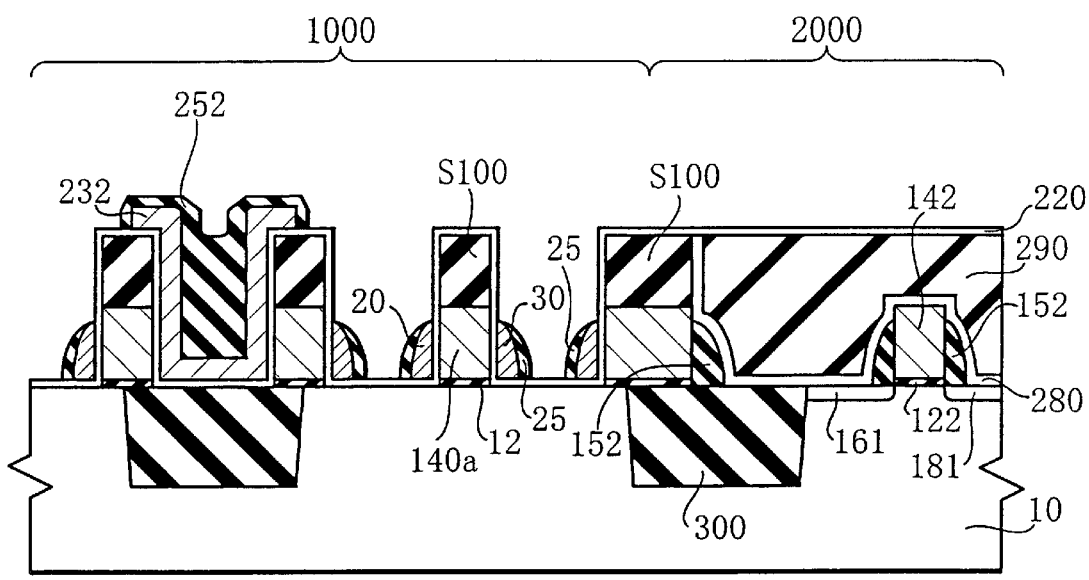
FIG. 16 is a cross-sectional view showing a step of a method of fabricating the semiconductor device shown in FIGS. 1 to 3.

The entire surface of the insulating layer 250 (see FIG. 15) is anisotropically etched, whereby the insulating layers 25 are formed on the first and second control gates 20 and 30, and the third contact insulating layer 252 is formed on the second contact conductive layer 232 in the memory region 1000, as shown in FIG. 16. The logic circuit region 2000 is covered with at least the first and second protective insulating layers 280 and 290.

Figure 17:
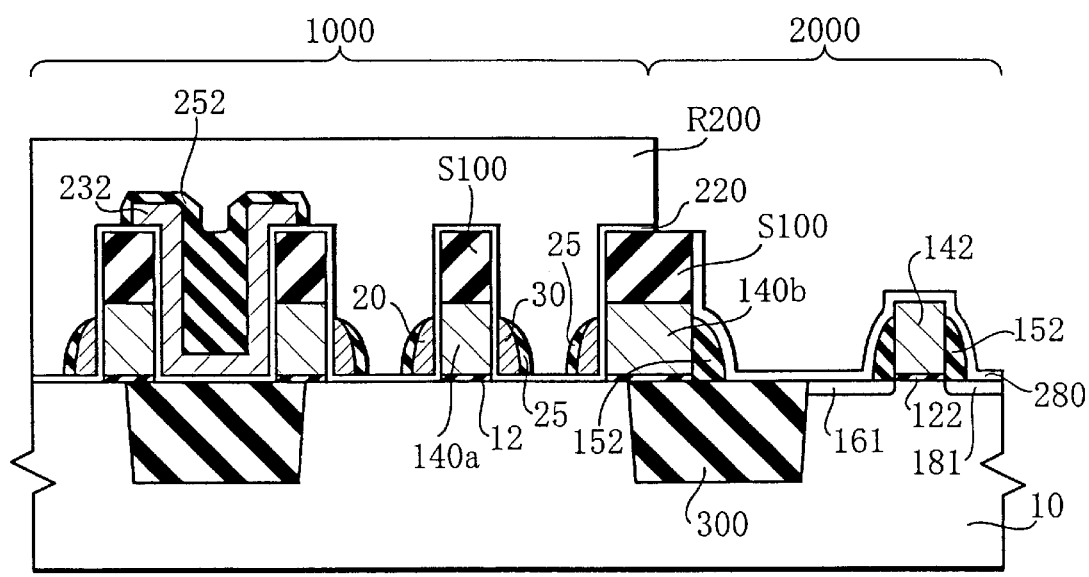
FIG. 17 is a cross-sectional view showing a step of a method of fabricating the semiconductor device shown in FIGS. 1 to 3.

(10) After masking the memory region 1000 by forming a second resist layer R200, the second protective insulating layer 290 (see FIG. 16) is removed in the logic circuit region 2000 by etching, as shown in FIG. 17. The second resist layer R200 is formed so that the end on the side of the logic circuit region 2000 is located over the boundary section 140b. The second protective insulating layer 290 can be removed completely by forming the second resist layer R200 in this manner. The second resist layer R200 is then removed.

Figure 18:
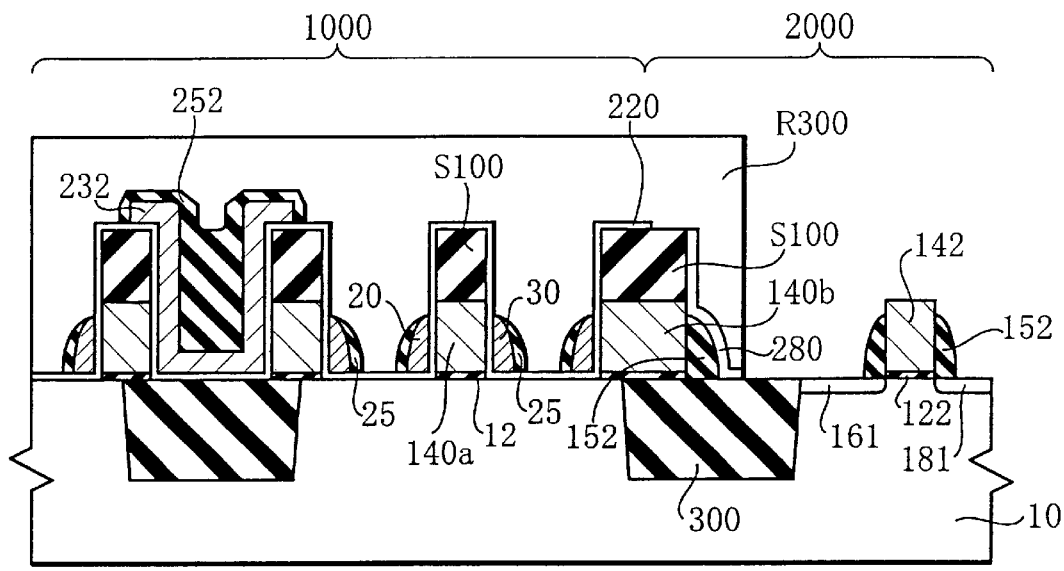
FIG. 18 is a cross-sectional view showing a step of a method of fabricating the semiconductor device shown in FIGS. 1 to 3.

(11) After forming a third resist layer R300 in the memory region 1000, the first protective insulating layer 280 (see FIG. 17) is removed in the logic circuit region 2000, as shown in FIG. 18. The third resist layer R300 is formed so that the end in the logic circuit region 2000 is located on the element isolation region 300 at an interval from the boundary section 140b. The reason for forming the third resist layer R300 in this manner is as follows: When the first protective insulating layer 280 is formed of silicon nitride, the first protective insulating layer 280 can be removed by thermal phosphoric acid. Since the stopper layers S100 are also formed of silicon nitride, the third resist layer R300 is formed to cover the stopper layers S100 on the boundary section 140b so that the stopper layer S100 in the boundary region between the memory region 1000 and the logic circuit region 2000 is not removed when removing the first protective insulating layer 280. The third resist layer R300 is then removed.

Figure 19:
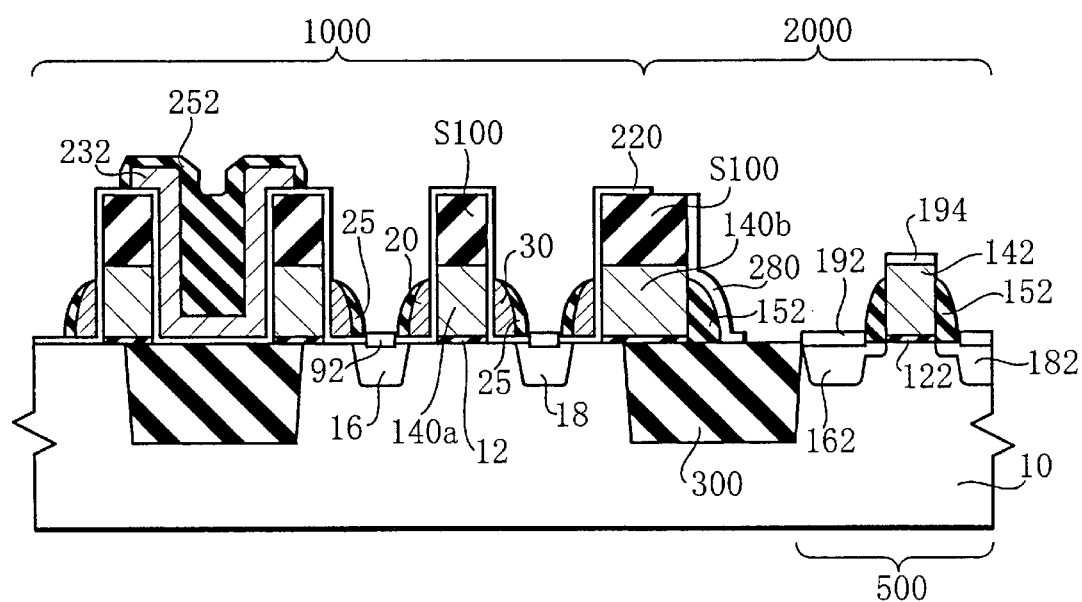
FIG. 19 is a cross-sectional view showing a step of a method of fabricating the semiconductor device shown in FIGS. 1 to 3.

(12) The impurity layers 16 and 18 which form either the source region or drain region in the memory region 1000 and the impurity layers 162 and 182 which form either the source region or drain region in the logic circuit region 2000 are formed in the semiconductor substrate 10 by ion implantation of impurities such as N-type impurities into the entire surface, as shown in FIG. 19.

Silicide layers 92, 192 and 194 such as a titanium silicide layer or cobalt silicide layer can be formed on the exposed areas of the impurity layers 16, 18, 162 and 182 and the upper surface of the gate electrode 142 by a conventional method. The MOS transistor 500 is formed in this manner. No silicide layer is formed on the control gates 20 and 30, since the insulating layers 25 are formed on the surfaces of the control gates 20 and 30.

(13) The insulating layer 270 (see FIG. 20) formed of silicon oxide, silicon nitride oxide or the like is formed over the entire surface of the memory region 1000 and the logic circuit region 2000. The insulating layer 270 is formed to cover the stopper layers S100.

Figure 20:
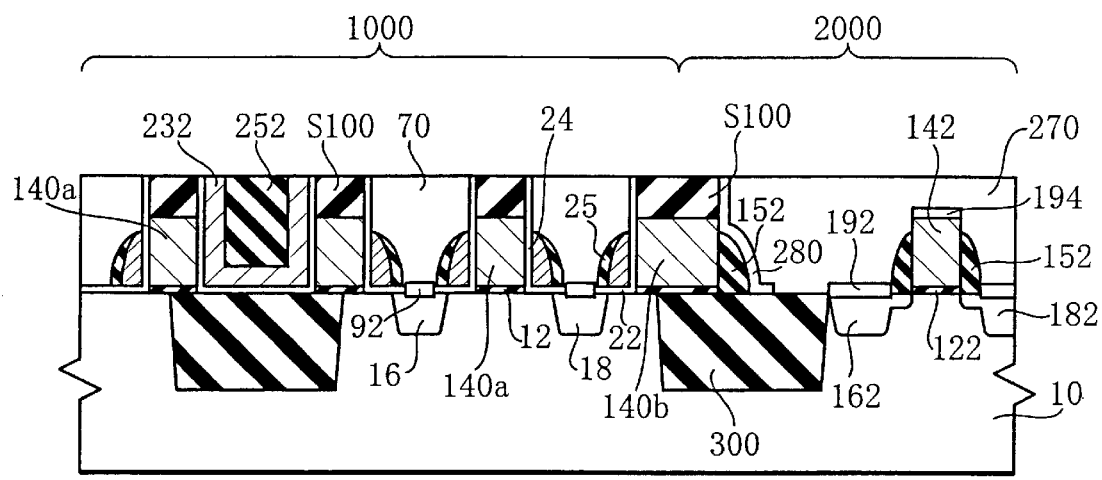
FIG. 20 is a cross-sectional view showing a step of a method of fabricating the semiconductor device shown in FIGS. 1 to 3.

The insulating layer 270 is polished using a CMP process so that the stopper layers S100 are exposed, whereby the insulating layer 270 is planarized, as shown in FIG. 20. The MOS transistor 500 is covered with the insulating layer 270 in the logic circuit region 2000.

The buried insulating layer 70 is formed between the opposing side insulating layers 24 with the control gates 20 and 30 interposed therebetween. This step causes the first and second control gates 20 and 30 to be completely covered with the buried insulating layer 70 and exposes the second conductive layer 232.

Figure 21:
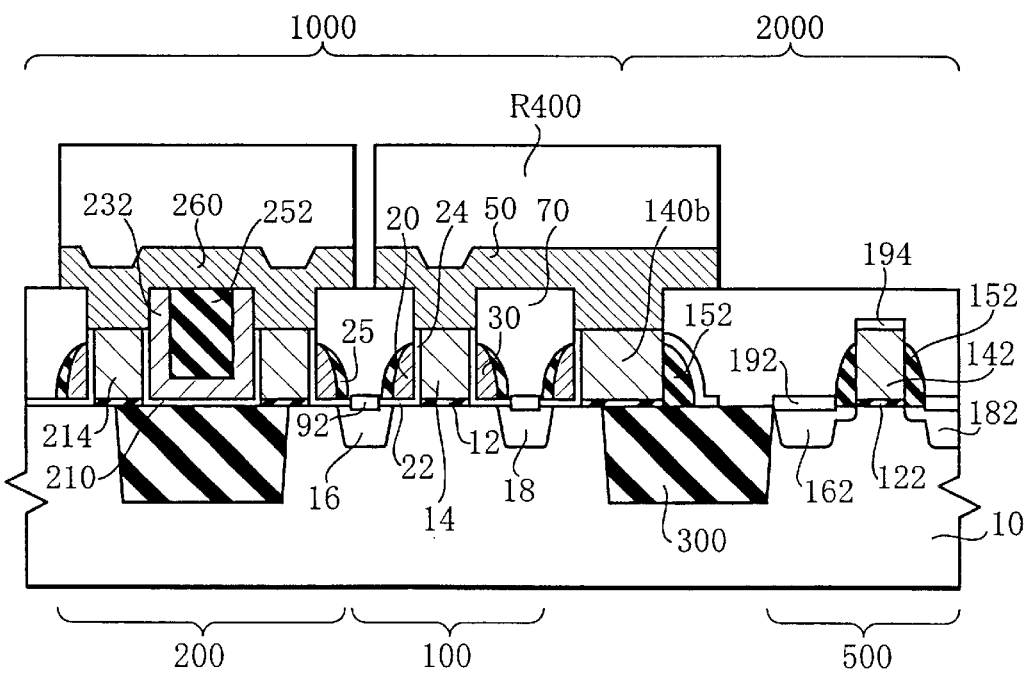
FIG. 21 is a cross-sectional view showing a step of a method of fabricating the semiconductor device shown in FIGS. 1 to 3.
Figure 22:
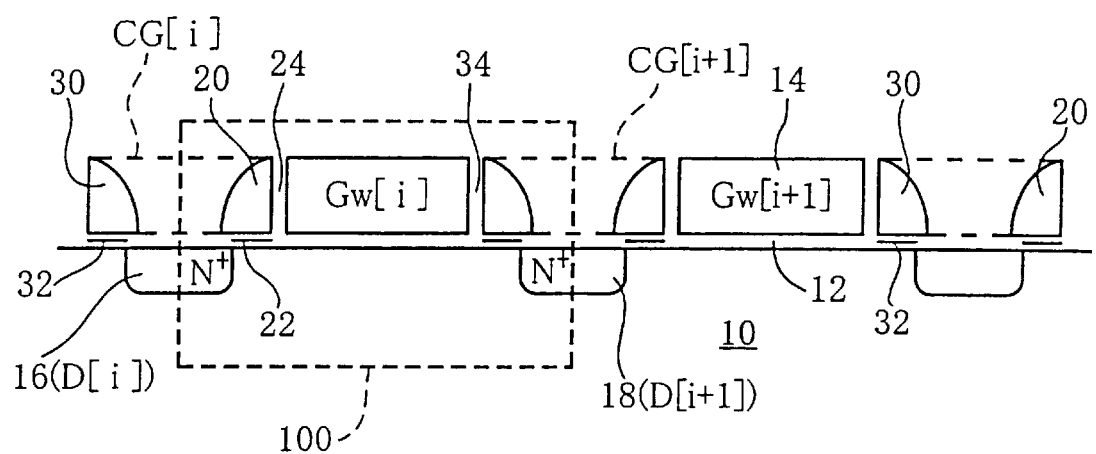
FIG. 22 is a cross-sectional view showing a conventional MONOS memory cell.

(14) The stopper layers S100 (see FIG. 20) are removed using thermal phosphoric acid, as shown in FIG. 21. A conductive layer is formed of a doped polysilicon layer in the memory region 1000 and the logic circuit region 2000.

A patterned resist layers R400 are formed on the doped polysilicon layer. The doped polysilicon layer is patterned using the resist layers R400 as a mask, thereby forming the word lines 50 and the third contact conductive layers 260.

The word gate layer 140a (see FIG. 20) is etched using the resist layers R400 as a mask. The word gate layer 140a is removed by this etching in the regions in which the word lines 50 are not formed. As a result, the word gates 14 arranged in an array can be formed. The regions in which the word gate layer 140a is removed correspond to the regions in which the P-type impurity layers (element isolation impurity layers) 15 (see FIG. 2) are formed later.

In this etching step, the conductive layers 40 which form the first and second control gates 20 and 30 remain without being etched since the conductive layers 40 are covered with the buried insulating layers 70. The MOS transistor 500 in the logic circuit region 2000 is not affected by this etching since the MOS transistor 500 is completely covered with the insulating layer 270.

The entire surface of the semiconductor substrate 10 is doped with P-type impurities. This causes the P-type impurity layers (element isolation impurity layers) 15 (see FIG. 2) to be formed in the regions between the word gates 14 adjacent in the Y direction. The elements of the nonvolatile semiconductor memory device 100 can be isolated from one another more reliably by the P-type impurity layers 15.

(15) After forming an interlayer dielectric, contact holes are formed by a conventional method. Conductive layers and interconnect layers can be formed in the contact holes. For example, after forming a contact hole in the interlayer dielectric 72, the conductive layer 82 and the interconnect layer 80 connected to the common contact section 200 are formed, as shown in FIG. 3. Contact sections and interconnect layers can also be formed in the logic circuit region 2000 during this step.

The semiconductor device shown in FIGS. 1 to 3 can be fabricated by these steps.

Advantages obtained by this fabrication method are as follows:

First, ion implantation steps for forming the source/drain regions 16 and 18 of the memory cells 100 and the source/drain regions 162 and 182 of the MOS transistors 500 can be performed at the same time in the step (12).

Second, steps for self-alignably forming the silicide layers on the source/drain regions 16 and 18 of the memory cells 100 and the gate electrodes 142 and the source/drain regions 162 and 182 of the MOS transistors 500 can be performed at the same time in the step (12).

Third, in the step (14) for patterning the word gates 14 of the memory cells 100, since the MOS transistors 500 are covered with the insulating layer 270, characteristics of the MOS transistors 500 are not affected by exposure to etching gas.

Fourth, since the source/drain regions 16 and 18 of the memory cells 100 and the source/drain regions 162 and 182 of the MOS transistors 500 can be formed in a comparatively later step, highly controlled impurity layers can be formed without being affected by the earlier thermal treatment.

The embodiment of the present invention is described above. However, the present invention is not limited thereto. Various modifications and variations are possible within the scope of the present invention. For example, a bulk semiconductor substrate is used as a semiconductor layer in the above embodiment. However, a semiconductor layer of an SOI substrate may be used.

What is claimed is:

1. A method of fabricating a semiconductor device including a memory region including nonvolatile memory devices and a logic circuit region including a peripheral circuit for the nonvolatile memory devices, the method comprising the following steps in that order:

a step of forming a first insulating layer over a semiconductor layer, a step of forming a first conductive layer over the first insulating layer, a step of forming a stopper layer over the first conductive layer, a step of removing the stopper layer in the logic circuit region, a step of patterning the first conductive layer in the logic circuit region, thereby forming gate electrodes of insulated gate field effect transistors in the logic circuit region, a step of forming sidewall insulating layers at least on both sides of the gate electrodes, a step of forming a protective insulating layer in the logic circuit region so as to cover at least the gate electrodes, a step of patterning the stopper layer and the first conductive layer in the memory region, a step of forming an ONO film over the entire surface of the memory region and the logic circuit region, a step of forming a second conductive layer over the ONO film, a step of anisotropically etching the second conductive layer, thereby forming control gates in the shape of sidewalls at least on both sides of the first conductive layer in the memory region with the ONO film interposed, a step of removing the protective insulating layer in the logic circuit region, a step of forming first impurity layers which form either a source region or a drain region of the nonvolatile memory devices and second impurity layers which form either a source region or a drain region of the insulated gate field effect transistors, a step of forming silicide layers on the surfaces of the first impurity layers, the second impurity layers and the gate electrodes, a step of forming a second insulating layer over the entire surface of the memory region and the logic circuit region, a step of polishing the second insulating layer so that the stopper layer is exposed in the memory region and the gate electrodes are not exposed in the logic circuit region, a step of removing the stopper layer in the memory region, and a step of patterning the first conductive layer in the memory region, thereby forming word gates of the nonvolatile memory devices in the memory region.

2. The method of fabricating a semiconductor device according to claim 1, further comprising:

a step of forming an element isolation impurity layer between the word gates adjacent in a direction in which the first impurity layers extend after forming the word gates.

3. A method of fabricating a semiconductor device including a memory region including nonvolatile semiconductor memory devices and a logic circuit region including a peripheral circuit for the nonvolatile memory devices, the method comprising the following steps in that order:

a step of forming a first insulating layer over a semiconductor layer, a step of forming a first conductive layer over the first insulating layer, a step of forming a stopper layer over the first conductive layer, a step of removing the stopper layer in the logic circuit region, a step of patterning the first conductive layer in the logic circuit region, thereby forming gate electrodes of insulated gate field effect transistors in the logic circuit region, a step of forming sidewall insulating layers at least on both sides of the gate electrodes, a step of forming a first protective insulating layer so as to cover at least the gate electrodes, a step of forming a second protective insulating layer over the entire surface of the memory region and the logic circuit region, a step of polishing the second protective insulating layer so that the stopper layer is exposed in the memory region, a step of patterning the stopper layer and the first conductive layer in the memory region, a step of forming an ONO film over the entire surface of the memory region and the logic circuit region, a step of forming a second conductive layer over the ONO film, a step of anisotropically etching the second conductive layer, thereby forming control gates in the shape of sidewalls at least on both sides of the first conductive layer in the memory region with the ONO film interposed, a step of forming a second insulating layer over the entire surface of the memory region and the logic circuit region, a step of removing the second insulating layer so that part of the semiconductor substrate is exposed in the memory region and the control gates are not exposed, a step of removing the second protective insulating layer and the first protective insulating layer in the logic circuit region, a step of forming first impurity layers which form either a source region or a drain region of the nonvolatile memory devices and second impurity layers which form either a source region or a drain region of the insulated gate field effect transistors, a step of forming silicide layers on the surfaces of the first impurity layers, the second impurity layers and the gate electrodes, a step of forming a third insulating layer over the entire surface of the memory region and the logic circuit region, a step of polishing the third insulating layer so that the stopper layer is exposed in the memory region and the gate electrodes are not exposed in the logic circuit region, a step of removing the stopper layer in the memory region, and a step of patterning the first conductive layer in the memory region, thereby forming word gates of the nonvolatile memory devices in the memory region.

4. The method of fabricating a semiconductor device according to claim 3, further comprising:

a step of forming an element isolation impurity layer between the word gates adjacent in a direction in which the first impurity layers extend after forming the word gates.

* * * * *